United States Patent [19]
Arai et al.

[11] Patent Number: 5,856,242
[45] Date of Patent: Jan. 5, 1999

[54] METHOD OF PRODUCING DIELECTRIC THIN FILM ELEMENT

[75] Inventors: Hisako Arai, Kashiwa; Ryusuke Kita, Matsudo; Yoshiyuki Masuda, Noda; Noboru Ohtani, Tokyo; Yoshiyuki Matsu, Kashiwa; Masayoshi Koba, Nara, all of Japan

[73] Assignee: Sharp Kabushiki Kaisha, Osaka, Japan

[21] Appl. No.: 672,233

[22] Filed: Jun. 27, 1996

[30] Foreign Application Priority Data

Jul. 21, 1995 [JP] Japan .................................... 7-186025

[51] Int. Cl.$^6$ .................................................. H01L 21/31
[52] U.S. Cl. .......................... 438/770; 438/778; 427/578; 427/576
[58] Field of Search ........................ 437/235; 427/255.3, 427/226, 576, 578; 438/770, 778, 763, 762

[56] References Cited

U.S. PATENT DOCUMENTS

| | | | |
|---|---|---|---|
| 3,911,176 | 10/1975 | Curtis | 427/248 |
| 5,192,871 | 3/1993 | Ramakrishnan et al. | 257/595 |
| 5,527,567 | 6/1996 | Desu et al. | 427/573 |
| 5,527,629 | 6/1996 | Gastiger et al. | 428/688 |
| 5,618,575 | 4/1997 | Peter | 427/8 |
| 5,670,218 | 9/1997 | Baek | 427/576 |

FOREIGN PATENT DOCUMENTS

| | | |
|---|---|---|
| 519117A1 | 10/1991 | European Pat. Off. . |
| 07072339 B2 | 8/1995 | Japan . |

OTHER PUBLICATIONS

T. Fujii et al., Applied Physics Letters, 62:3204–3206 (Jun. 14, 1993) "Preparation of CATIO$_3$ heteroepitaxial thin films by excimer laser deposition".

C.H. Mueller et al., Thin Solid Films, 238:123–126 (Jan. 15, 1994) "Effect of oxygen pressure on the orientation of YBa$_2$Cu$_3$O$_{7-x}$/SrTiO$_3$ films deposited on (1102) Al$_2$O$_3$ substrates".

J. Lee et al., Applied Physics Letters 63:27–29 (Jul. 5, 1993), "Effects of crystalline quality and electrode material on fatigue in Pb(Zr,Tl)O$_3$ thin firm capacitors".

IEEE Catalog No. 94CH3404–1, Jan. 25–28, 1994, pp. 164–168, Oiso, Japan, "Micro Electro Mechanical Systems".

"Electric Properties of SrTiO$_3$ Thin Films Prepared by RF Sputtering", by T. Kuroiwa et al., Japan Journal of Applied Physics, vol. 31 (1992) pp. 3025–3028 Part 1 No. 98, Sep. 1992.

Taguchi, Electrical properties of SrFeO3 under various partial pressures of oxygen, Journal of Materials Science Letters, 665–666, Apr. 26, 1983.

Cheng, Electrical Breakdown Characteristics and Oxidation Properties of Partial and Two–Step Oxidation Techniques, Journal of the Electrochemical Society, Feb. 1988.

*Primary Examiner*—Charles L. Bowers, Jr.
*Assistant Examiner*—Reneé R. Berry
*Attorney, Agent, or Firm*—Birch, Stewart, Kolasch & Birch, LLP

[57] ABSTRACT

A method for preparing an oxide dielectric thin film, for use in a dielectric thin film device, is described. Briefly, a film forming chamber is heated, and a thin film of dielectric, about 200 nm thick, is formed by sputtering or another deposition method. After the film is formed, evacuation of the film forming chamber is suspended, and oxygen gas is introduced into the chamber. The film is oxidized after its formation by maintaining the film in the oxygen atmosphere for a period of time, which can include cooling steps. The resulting dielectric thin film has excellent dielectric properties, such as a high dielectric constant and great dielectric strength.

20 Claims, 7 Drawing Sheets

METHOD OF PRODUCING DIELECTRIC THIN FILM ELEMENT

FIELD OF THE INVENTION

The present invention relates to a method of producing a dielectric thin film device. Specifically, the present invention relates to a method of producing a dielectric thin film device provided with at least electrodes and an oxide dielectric thin film, for use in a non-volatile memory device, a capacitor, a light modulation device, a piezoelectric device, a pyroelectric infrared ray sensor, and other device.

BACKGROUND OF THE INVENTION $SiO_2$ (silicon dioxide) or SiN (silicon nitride) is usually used as a dielectric material when producing a thin film capacitor for use in an integrated circuit (IC), such as a signal storing capacitor in a DRAM (Dynamic Random Access Memory). Recently, as demand for a more highly integrated semiconductor device is increasing, a dielectric material which has high dielectric constant and small leakage current is also increasingly sought after. This has led to today's active research on oxide dielectric thin films with high dielectric constant, made of such materials as STO ($SrTiO_3$, strontium titanate), or (Ba, Sr) $TiO_3$ (barium strontium titanate), either of which has a dielectric constant higher than conventional dielectric materials such as $SiO_2$ and SiN.

For example, Japan Journal Applied Physics. Vol. 31 (1992, pp. 3025–3028, T. Kuroiwa et al.) discloses a study of electric properties of an oxide dielectric STO film which is made by employing an RF (radio frequency) sputtering method.

According to this publication, the oxide dielectric STO film is formed in the manner presented as follows. First, on an Si substrate, a thermally-oxidated Si film with a thickness of 300 nm and a Pt film with a thickness of 100 nm as a lower electrode are laminated in this order in a film forming chamber at a temperature of 600° C. Thereafter, with the pressure of oxygen in the film forming chamber maintained at 26.6 Pa, an RF sputtering is conducted so that an oxide dielectric STO film with a thickness of 75 nm is formed on the Pt film. After the film formation, the substrate is cooled down in the oxygen atmosphere. To evaluate the electric properties of the oxide dielectric STO film, other Pt films as upper electrodes are formed on the oxide dielectric STO film at room temperature.

According to the evaluation, when a voltage of 2 V was applied to the STO film through the upper and lower electrodes, the oxide dielectric STO film had a leakage current of $4.0\times10^{-9}$ $A/cm^2$ and a dielectric constant of 205. It is reported as a result of the evaluation that the leakage current depended greatly on the oxygen defects contained in the film, while it did not depend on the dispersion of Pt atoms from the lower electrode to the oxide dielectric STO film. It is also reported that conditions of the oxygen atmosphere can be an important factor in determining the quality of an oxide dielectric STO film. To be more specific, the higher the pressure of the oxygen in the chamber during film formation, the less oxygen defects are formed in the oxide dielectric STO film.

An oxide dielectric thin film is generally manufactured by the following methods: a sputtering method, MOCVD (Metalorganic Chemical Vapor Deposition) method, a reactive vapor deposition method, and a laser ablation method. The following description briefly explains these methods. According to the sputtering method, ions are collided against a target in a low-pressure atmosphere so that atoms or molecules from the target are deposited on a substrate. According to the MOCVD method, a substrate is heated up so that a thin film is formed on the substrate based on a mutual thermal decomposition and a chemical reaction between an organometal compound and a group five hydrogen compound. According to the reactive vapor deposition method, when oxygen, for example, is utilized, a material is thermo-evaporated at the pressure of oxygen so that a reaction is caused between the vaporised material and the oxygen, and a product thus obtained through the reaction is deposited on the substrate. On the other hand, according to the laser ablation method which utilizes dense photons of a laser, a laser is projected on the surface of an evaporative material so that a chemical bond on the surface of the evaporative material is cut causing the evaporative material to be evaporated, thereby causing a thin film to be formed on the substrate.

After an oxide dielectric thin film is formed in an oxygen atmosphere and at a constant temperature by employing either of the above-mentioned methods, either of the following four conventional methods is usually applied as a post-treatment: a first conventional method of cooling the substrate while stopping the supply of oxygen; a second conventional method of cooling the substrate while leaving it in the same oxygen atmosphere that was used in the film formation process; a third conventional method of cooling the substrate in an oxygen atmosphere such as an oxygen gas or an oxygen plasma; and a fourth conventional method of taking the substrate out of the film forming chamber and applying a heat treatment to the substrate in an oxygen atmosphere.

However, if either of these conventional post-treatments is applied after forming an oxide dielectric thin film, the oxide dielectric thin film device thus obtained has such unfavorable properties as low dielectric constant, great leakage current, and small dielectric strength. It is considered that the reason is that oxygen is not sufficiently absorbed in the film during the film formation process, thereby causing a lot of oxygen defects in the crystal lattice of the oxide dielectric thin film. Regarding the fourth conventional post-treatment method, since the substrate is once taken out of the film forming chamber after the film formation, moisture and carbon dioxide in the air are adhered to the film surface, thereby obstructing the absorption of oxygen into the film. It is seen that this causes a lot of oxygen defects in the crystal lattice.

Thus, when an oxide dielectric thin film to which such a conventional post-treatment has been applied is used for producing an oxide dielectric thin film device, the following problem arises. It is impossible to steadily obtain an oxide dielectric thin film device having preferable dielectric properties, such as being superior in insulation, having dielectric constant as high as bulk's, and hardly exhibiting dielectric breakdown.

Then, it may be expected that such a problem can be solved by raising the oxygen pressure in the film forming process so that enough oxygen is absorbed. However, considering the principles of the film forming methods, the foregoing methods of film forming (the sputtering method, the MOCVD method, the reactive vapor deposition method, and the laser ablation method) is virtually infeasible. To be more specific, regarding the sputtering method, since the method, according to the principles, naturally tends to cause glow discharge by applying DC voltage or high frequency voltage, abnormal discharge tends to happen when, for example, gas of around 50 Pa or above is introduced.

Therefore, it is difficult to obtain the stable glow discharge. As to the MOCVD method, the reactive vapor deposition method, and the laser ablation method, it is requisite that the vapor pressure of the materials is higher than the degree of vacuum. But, it is extremely difficult, when the pressure of oxygen is high, to achieve a vapor pressure of, for example, around 50 Pa or above by heating evaporative materials.

SUMMARY OF THE INVENTION

The present invention is made in the light of the fact that dielectric properties of an oxide dielectric thin film for use in the dielectric thin film device are greatly affected by the amount of oxygen absorbed into the oxide dielectric thin film. The object of the present invention is to provide a method (1) of producing an oxide dielectric thin film which absorbs enough oxygen, and (2) of producing a dielectric thin film device which has dielectric properties such as small leakage current, superiority in insulation, high dielectric constant, and great dielectric strength.

To achieve the above object, the method of the present invention for producing a dielectric thin film device, which is provided with at least electrodes and an oxide dielectric thin film, comprises the steps of (1) forming on a substrate the oxide dielectric thin film having a predetermined thickness in a film forming chamber, and introducing oxygen into the film forming chamber so that pressure of the introduced oxygen is higher than that during the oxide dielectric thin film formation, without taking the oxide dielectric thin film out of the film forming chamber, and (2) keeping a substrate for a predetermined period of time in the film forming chamber and then cooling it down in the film forming chamber.

According to the foregoing arrangement, after the formation of the oxide dielectric thin film, the pressure of oxygen in the film forming chamber is raised by introducing oxygen therein, and the substrate is kept in the above atmosphere for a certain period of time, then cooled down. Thereby, even though oxygen is not sufficiently absorbed in the film in the film forming process due to changes in conditions of the film formation, such as filming period and temperature, enough oxygen is supplied to the oxide dielectric thin film after the film formation is completed. In addition, since the oxide dielectric thin film is not taken out of the film forming chamber while oxygen is introduced, neither moisture nor carbon dioxide in the air adheres to the surface of the film. Namely, no obstacles are caused for the supply of oxygen to the film. Therefore, the foregoing method ensures the absorption of oxygen into the film, thereby reducing the oxygen defects in the oxide dielectric thin film.

The dielectric properties of the dielectric thin film device greatly depends on the amount of oxygen contained in the oxide dielectric thin film employed in the dielectric thin film device. In other words, the more oxygen is contained in the film, the better dielectric properties the dielectric thin film device has. Therefore, since an oxide dielectric thin film which has less oxygen defects can be achieved by the foregoing arrangement, it follows that by utilizing such an oxide dielectric thin film, it is also ensured to provide a high-quality dielectric thin film device having improved dielectric properties, such as higher dielectric constant, smaller leakage current, and less dielectric breakdown voltage than before.

More preferably, the pressure of oxygen is set to or higher than 100 Pa. In this case, even though oxygen is not sufficiently absorbed in the oxide dielectric thin film in the film forming process, the oxide dielectric thin film is adequately supplied with oxygen after the film formation. Therefore, when a dielectric thin film device is produced by utilizing the oxide dielectric thin film, a dielectric thin film device can be fabricated, which is characterized by remarkably small leakage current and which has high dielectric breakdown strength.

Further preferably, the substrate provided with the oxide dielectric thin film is kept in the film forming chamber for 5 minutes or more after introducing oxygen therein. In this case, even though oxygen is not sufficiently absorbed in the oxide dielectric thin film in the film forming process, the oxide dielectric thin film is adequately supplied with oxygen after the film formation. Accordingly, by utilizing such an oxide dielectric thin film, it is ensured to provide a high-quality dielectric thin film device having improved dielectric properties, such as higher dielectric constant, smaller leakage current, and higher dielectric breakdown voltage. In addition, with the foregoing arrangement, the yield can be surely increased.

For a fuller understanding of the nature and advantages of the invention, reference should be made to the ensuing detailed description taken in conjunction with the accompanying drawings.

BRIEF DESCRIPTION OF THE DRAWINGS

FIG. 7(a) is a graph illustrating the correlation between the pressure of oxygen and the leakage current, while FIG. 7(b) is a graph illustrating the correlation between the pressure of oxygen and the insulation unbreakdown ratio.

DESCRIPTION OF THE PREFERRED EMBODIMENTS

Figure 1:
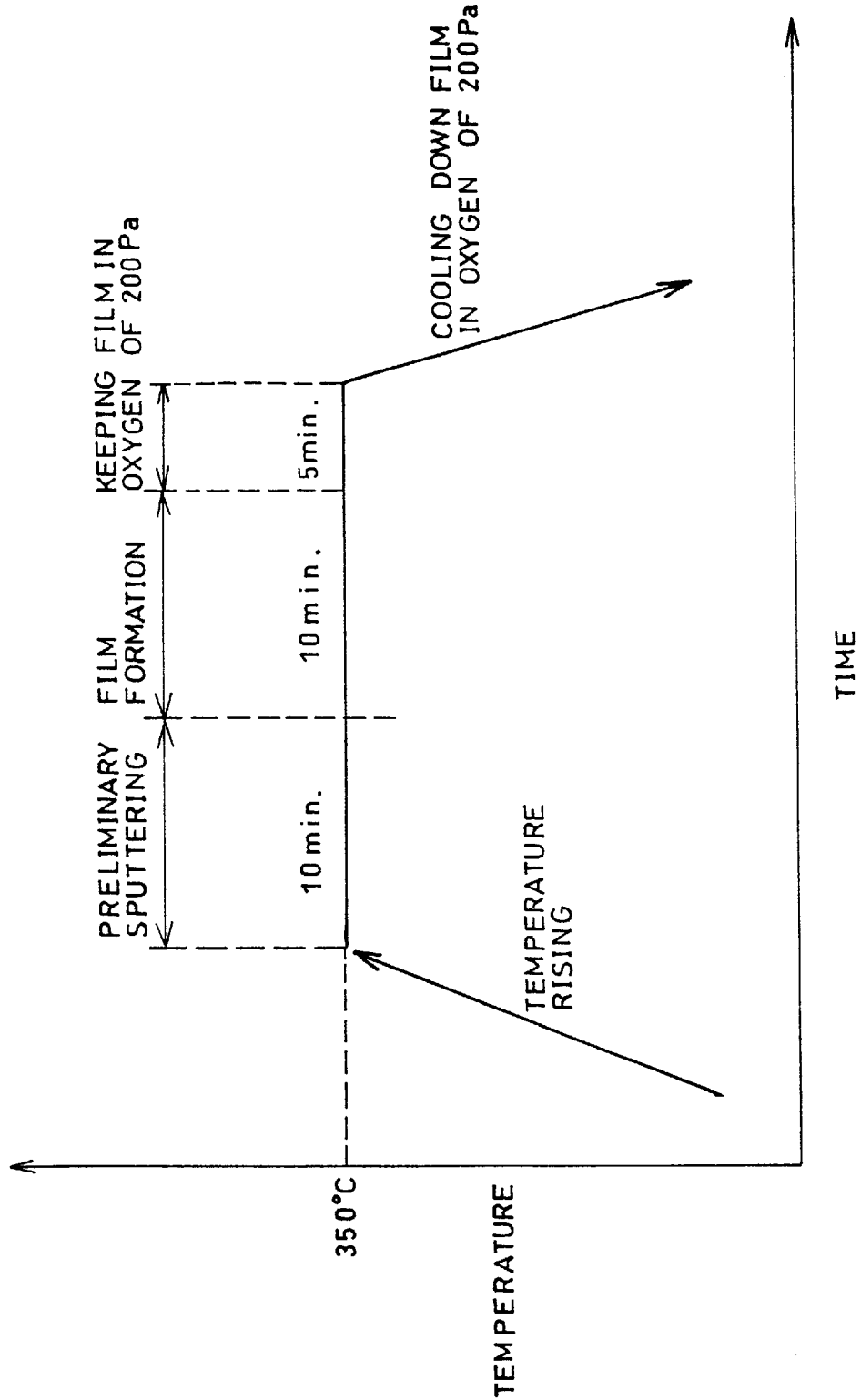
FIG. 1 is an explanatory view illustrating the process of producing an oxide dielectric thin film of an embodiment in accordance with the present invention.
Figure 2:
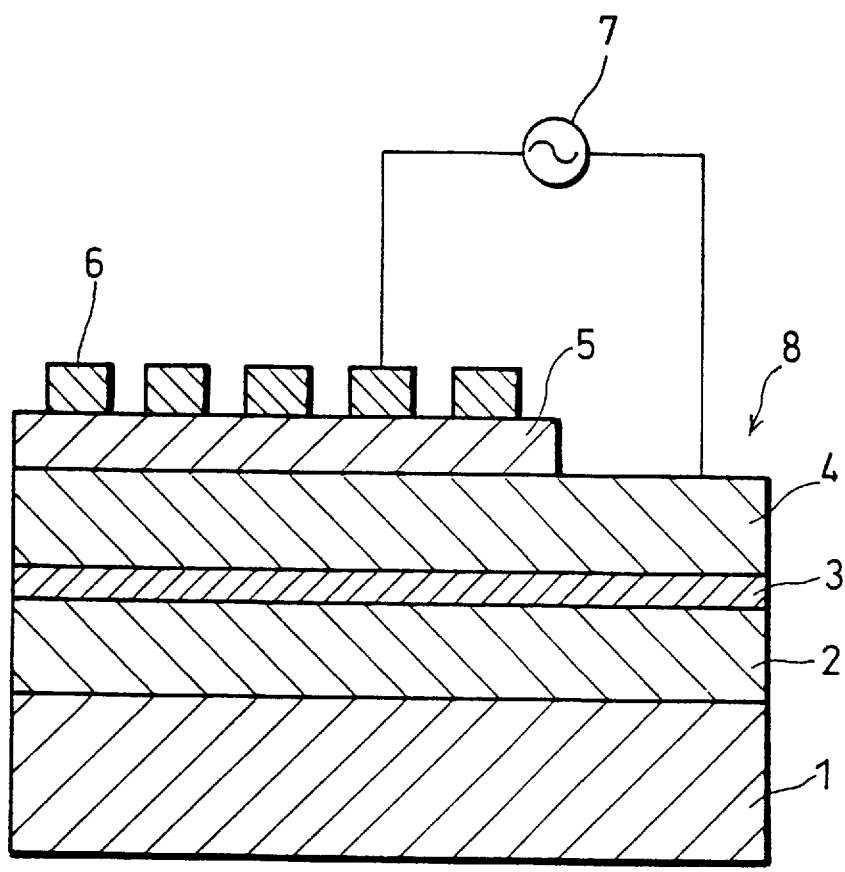
FIG. 2 is a cross-sectional view illustrating the structure of an oxide dielectric thin film device employing the oxide dielectric thin film.

The following description describes an embodiment of the present invention with reference to FIGS. 1 and 2.

FIG. 2 is a schematic cross-sectional view illustrating the structure of an oxide dielectric thin film device 8 in accordance with the present invention. The oxide dielectric thin film device 8 is provided with an oxide dielectric thin film produced through a production process (described below) in accordance with the present invention. The oxide dielectric thin film device 8 was formed to evaluate its electrical properties, such as dielectric constant, leakage current, and dielectric strength. To begin with, the device structure of the oxide dielectric thin film device 8 will be explained below.

As FIG. 2 shows, Si (silicon) thermal-oxidized film 2 with a thickness of 200 nm was formed on the surface of an n-type silicon substrate 1, while a Ti (titanium) film 3 with a thickness of 30 nm was formed on the Si thermal-oxidized film 2. On the Ti film 3, a Pt (platinum) film with a thickness of 200 nm was formed by a DC sputtering method. Hereinafter the Pt film is referred to as Pt lower electrode 4. On the Pt lower electrode 4, an oxide dielectric STO film 5 with a thickness of 200 nm was formed by a production method which will be described later. In addition, on the oxide dielectric STO film 5, Pt films which were respectively 100 μm square in size and 200 nm thick were formed by an electron-beam vapor deposition method. Note that hereinafter these Pt films are referred to as Pt upper electrodes 6.

As to the production method of the oxide dielectric STO film 5, the production process is illustrated in FIG. 1. The following description will explain the process in detail with reference to FIG. 1. Note that the sputtering is carried out in accordance with an RF (radio frequency) magnetron method which utilizes magnetron discharge in which the electric field is orthogonal to the magnetic field. As a sputter target, sintered $SrTiO_3$ was employed.

First, a film forming chamber was heated to 350° C., where preliminary sputtering was carried out for 10 minutes with respect to the surface of the target prior to film formation, under the conditions shown in Table 1.

TABLE 1

| Sputter RF Power | 4.25 W/cm² |
|---|---|
| Sputter Pressure | 2 Pa |
| Sputter Gas Ratio | Ar:O₂ = 1:1 |

Then, under the same conditions, a further sputtering was carried out with respect to the surface of the target for 10 minutes, thereby forming a sample having an oxide dielectric STO film 5 with a thickness of 200 nm. Thereafter, without taking the sample out, the evacuation of the film forming chamber was suspended and oxygen gas was introduced therein so that the atmospheric pressure in the film forming chamber was raised up to 200 Pa. After the sample was left in the film forming chamber for 5 minutes at a temperature of 350° C., it was cooled down in the same atmosphere of oxygen at a cooling speed of 3° C./min.

The dielectric properties (dielectric constant, leakage current, and dielectric strength) of the oxide dielectric thin film device 8 were measured under the following conditions. An A.C. voltage of 10 kHz was applied by an AC power source 7 through the Pt upper and lower electrodes 6 and 4 of the oxide dielectric thin film device 8, and the measurement was made at a temperature of 25° C. A set of the results is shown in Table 2, given a lot number (a). As to the leakage current, electric current which was leaked when the alternating voltage was 10 V and 20 V, respectively, was measured as "leaked electric current". As to the dielectric breakdown, the insulation of 160 capacitors was checked under the condition that the alternating voltage was set to 50 V. The ratio of remaining insulation is presented as the "insulation unbreakdown ratio".

TABLE 2

| Lot Number | Dielectric Constant | Leaked Electric Current (A/cm²) | | Insulation Unbreakdown Ratio (%) |
|---|---|---|---|---|
| | | (10 V) | (20 V) | |
| (a) | 156 | $3.3 \times 10^{-8}$ | $1.2 \times 10^{-7}$ | 95 |
| (b) | 135 | $2.6 \times 10^{-7}$ | $4.5 \times 10^{-6}$ | 5 |

TABLE 2-continued

| Lot Number | Dielectric Constant | Leaked Electric Current (A/cm²) | | Insulation Unbreakdown Ratio (%) |
|---|---|---|---|---|
| | | (10 V) | (20 V) | |
| (c) | 140 | $1.6 \times 10^{-7}$ | $2.3 \times 10^{-6}$ | 10 |

[First Comparative Example]

Figure 3:
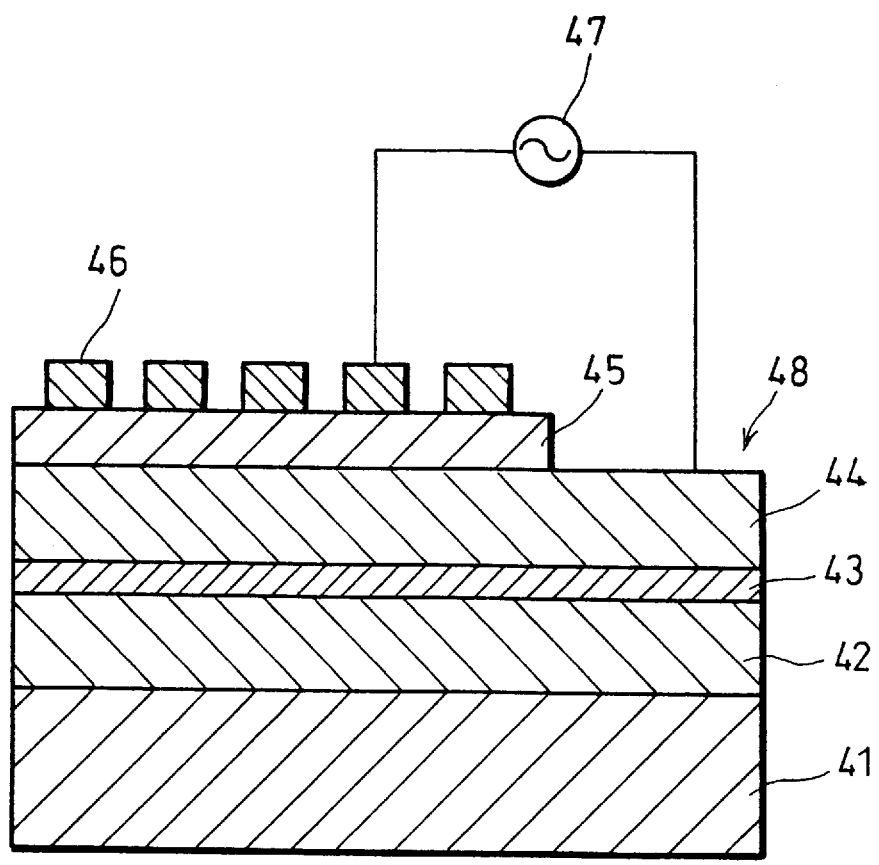
FIG. 3 is a cross-sectional view illustrating the structure of an oxide dielectric thin film device employing an oxide dielectric thin film produced through another process.

FIG. 3 is a schematic cross-sectional view illustrating a device structure of an oxide dielectric thin film device 48. FIG. 3 is for comparing with the foregoing embodiment in accordance with the present invention. The second conventional post-treatment which is mentioned above was applied to an oxide dielectric thin film for use in the oxide dielectric thin film device 48. Note that the same oxide dielectric STO film as that employed in the foregoing embodiment was employed in the present example. The following description will explain the structure of the oxide dielectric thin film device 48.

As shown in FIG. 3, Si (silicon) thermal-oxidized film 42 with a thickness of 200 nm was formed on the surface of an n-type silicon substrate 41, while a Ti (titanium) film 43 with a thickness of 30 nm was formed on the Si thermal-oxidized film 42. On the Ti film 43, a Pt (platinum) film with a thickness of 200 nm was formed by the DC sputtering method. Note that hereinafter the Pt film is referred to as Pt lower electrode 44. On the Pt lower electrode 44, an oxide dielectric STO film 45 with a thickness of 200 nm was formed by a production method which will be described below. In addition, on the oxide dielectric STO film 45, Pt films which were respectively 100 μm square in size and 200 nm thick were formed by the electron-beam vapor deposition method. Note that hereinafter these Pt films are referred to as Pt upper electrodes 46.

Figure 4:
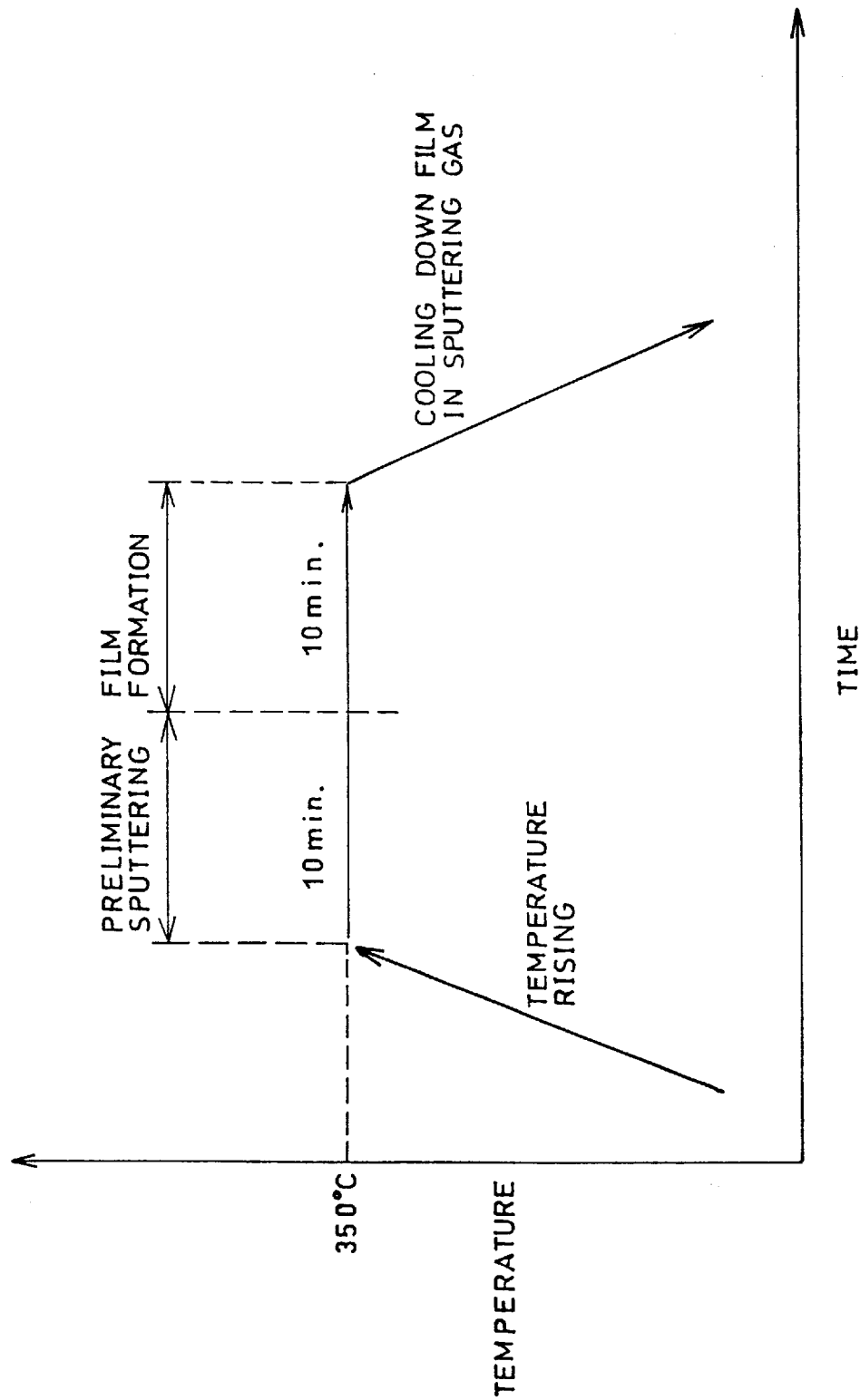
FIG. 4 is an explanatory view illustrating the process of producing the oxide dielectric thin film shown in FIG. 3.

Regarding the production method of the oxide dielectric STO film 45, the production process is illustrated in FIG. 4. With reference to FIG. 4, the following description will explain the process of producing the oxide dielectric STO film 45 in detail. Note that like in the foregoing embodiment, an RF (radio frequency) magnetoron method and sintered SrTiOs were employed as a sputtering method and as a sputter target, respectively.

First, the film forming chamber was heated to 350° C., where a preliminary sputtering was carried out for 10 minutes with respect to the surface of the target prior to film formation, under the conditions shown in Table 1 above. Then, under the same conditions, sputtering was further carried out with respect to the surface of the target for 10 minutes, thereby forming a sample having the oxide dielectric STO film 45 with a thickness of 200 nm. After that, according to the second conventional post-treatment, with the sample kept in the film forming chamber, the evacuation of the film forming chamber was suspended and the sample was cooled down in the same atmosphere of the sputtering gas at a cooling speed of 3° C./min.

Then, the dielectric properties (dielectric constant, leakage current, and dielectric strength) of the oxide dielectric thin film device 48 were measured under the following conditions. An A.C. voltage of 10 kHz was applied by an AC power source 47 through the Pt upper and lower electrodes 46 and 44 of the oxide dielectric thin film device 48, and the measurement was made at a temperature of 25° C. A set of results is shown in Table 2, given a lot number (b). Note that the conditions during the measurement were the same as those in the foregoing embodiment.

[Second Comparative Example]

Figure 5:
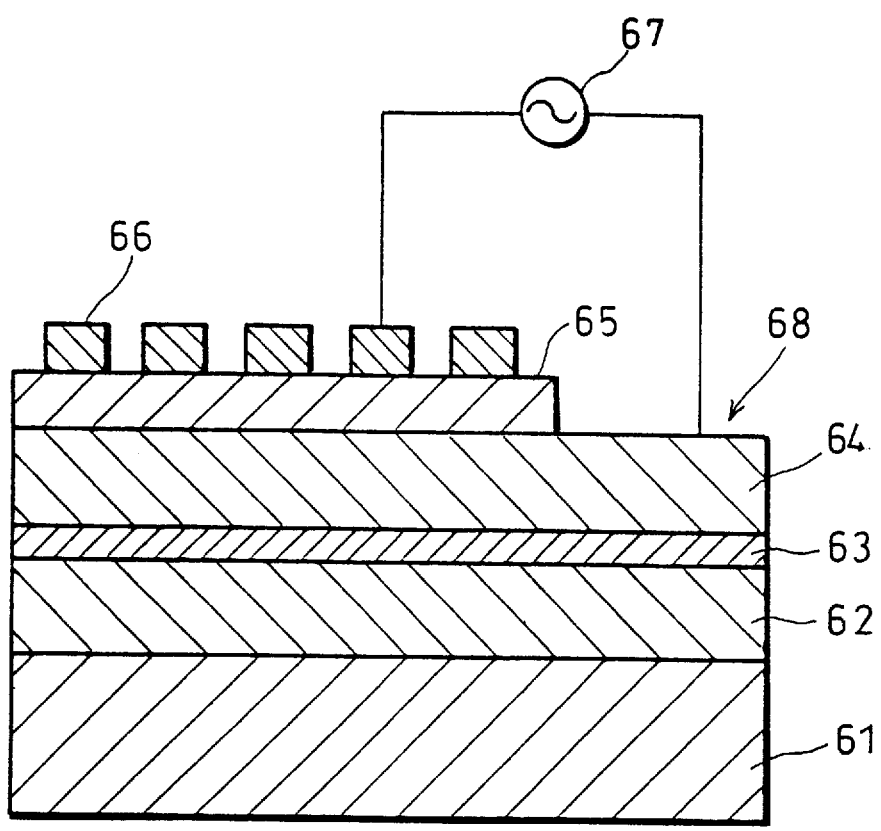
FIG. 5 is a cross-sectional view illustrating the structure of an oxide dielectric thin film device employing an oxide dielectric thin film produced through a still another production process.

FIG. 5 is a schematic cross-sectional view illustrating a device structure of an oxide dielectric thin film device 68. FIG. 5 is for comparing with the foregoing embodiment of the present invention. The fourth conventional post-treatment which is mentioned above was applied to an oxide dielectric thin film for use in the oxide dielectric thin film device 68. Note that the same oxide dielectric STO film as that in the foregoing embodiment was employed in the present example. The following description will explain the structure of the oxide dielectric thin film device 68.

As shown in FIG. 5, Si (silicon) thermal-oxidized film 62 with a thickness of 200 nm was formed on the surface of an n-type silicon substrate 61, while a Ti (titanium) film 63 with a thickness of 30 nm was formed on the Si thermal-oxidized film 62. On the Ti film 63, a Pt (platinum) film with a thickness of 200 nm was formed by the DC sputtering method. Note that hereinafter the Pt film is referred to as Pt lower electrode 64. On the Pt lower electrode 64, an oxide dielectric STO film 65 with a thickness of 200 nm was formed by a production method which will be described below. In addition, on the oxide dielectric STO film 65, Pt films which were respectively 100 $\mu$m square in size and 200 nm thick were formed by the electron-beam vapor deposition method. Note that hereinafter these Pt films are referred to as Pt upper electrodes 66.

Figure 6:
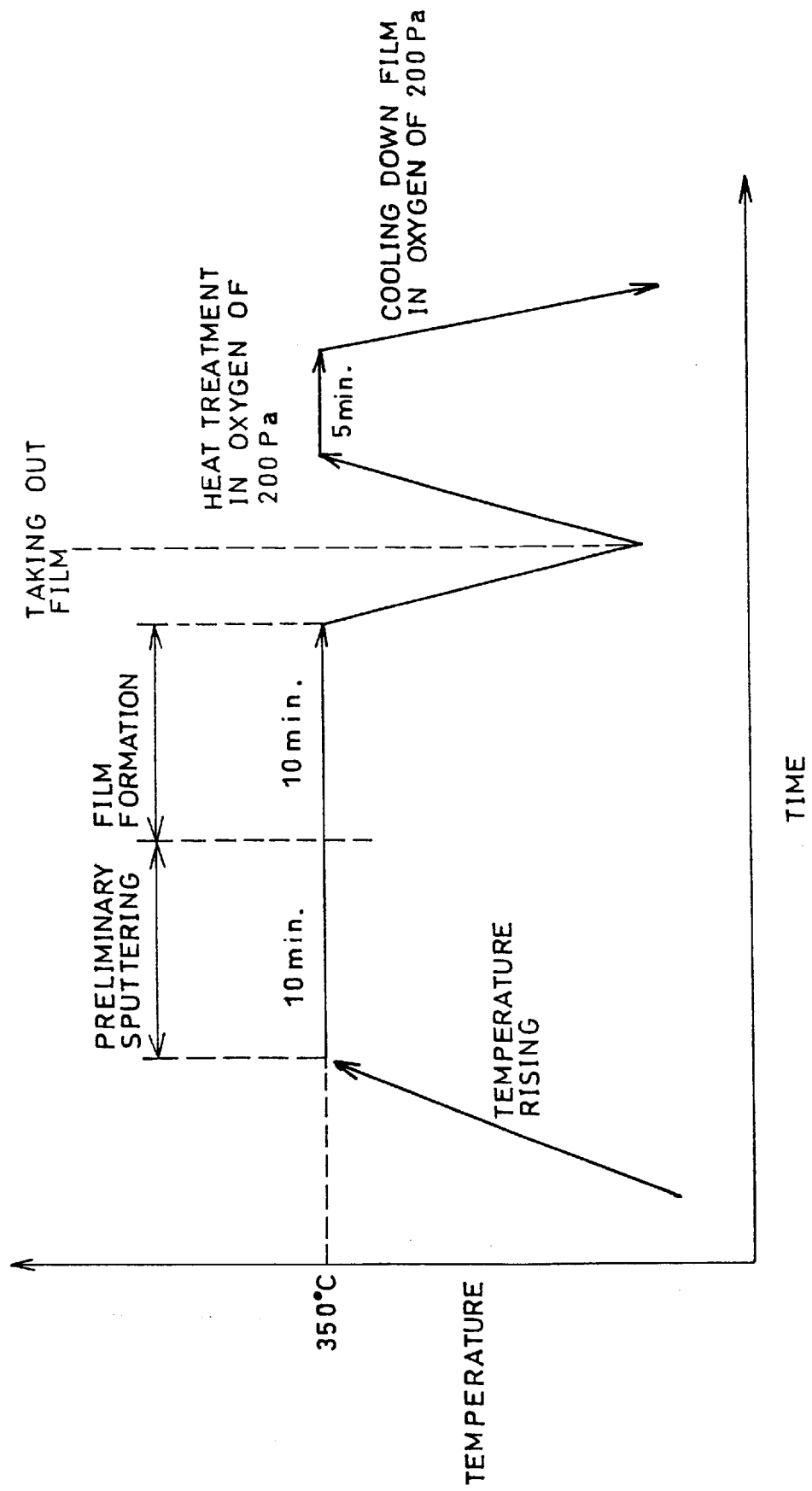
FIG. 6 is an explanatory view illustrating the process of producing the oxide dielectric thin film shown in FIG. 5.

Regarding the production method of the oxide dielectric STO film 65, the production process is illustrated in FIG. 6. With reference to FIG. 6, the following description will explain the process of producing the oxide dielectric STO film 65 in detail. Note that like in the foregoing embodiment, an RF (radio frequency) magnetoron method and sintered SrTiOs were employed as a sputtering method and as a sputter target, respectively.

First, the film forming chamber was heated to 350° C., where preliminary sputtering was carried out for 10 minutes with respect to the surface of the target prior to film formation, under the conditions shown in Table 1 above. Then, under the same conditions, sputtering was further carried out with respect to the surface of the target for 10 minutes, thereby forming a sample having an oxide dielectric STO film 65 with a thickness of 200 nm. Then, in accordance with the fourth conventional post-treatment, after the sample was taken out of the film forming chamber and exposed to the air, the sample was heated and kept at a temperature of 350° C. for 5 minutes in an oxygen atmosphere with a pressure of 200 Pa. After that, the sample was cooled down at a cooling speed of 3° C./min.

The dielectric properties (dielectric constant, leakage current, and dielectric strength) of the oxide dielectric thin film device 68 were measured under the following conditions. An A.C. voltage of 10 kHz was applied by an AC power source 67 through the Pt upper and lower electrodes 66 and 64 of the oxide dielectric thin film device 68, and the measurement was made at a temperature of 25° C. A set of the results is shown in Table 2, given a lot number (c). Note that the conditions during the measurement were the same as those in the foregoing embodiment.

As Table 2 reveals, concerning all the dielectric constants, leakage currents, and insulation unbreakdown ratios at a withstand voltage of 50 V, the oxide dielectric thin film device 8 of the foregoing embodiment was superior to the oxide dielectric thin film devices 48 and 68 of the first and second comparative examples. Especially the insulation unbreakdown ratio of the oxide dielectric thin film device 8 was outstanding. This indicates that dielectric breakdown hardly happens to the oxide dielectric thin film device 8.

Thus, the present invention ensures the production of an oxide dielectric thin film in which enough oxygen is absorbed, and consequently ensures the fabrication of a dielectric thin film device which is superior in dielectric properties such as dielectric constant, insulation, and dielectric strength. Furthermore, the oxide dielectric thin film is not made of $SiO_2$ or SiN but made of $SrTiO_3$ which has a high dielectric constant, thereby ensuring the fabrication of a dielectric thin film device having dielectric properties superior to the conventional one.

The foregoing embodiment deals with the oxide dielectric STO film 5 with a thickness of 200 nm. However, it is possible that an oxide dielectric STO film 5 has a different thickness, the thickness being achieved by changing the time spent for the film formation.

The oxide dielectric STO film 5 was formed in the foregoing embodiment at 350° C. However, similar effects were also obtained at a temperature falling in a range of 200° C. to 600° C.

According to the foregoing embodiment, after the film formation the sample having a film was kept for 5 minutes in the oxygen atmosphere without being taken out from the film forming chamber. However, similar effects were obtained when the keeping period was more than 5 minutes.

Figure 7:
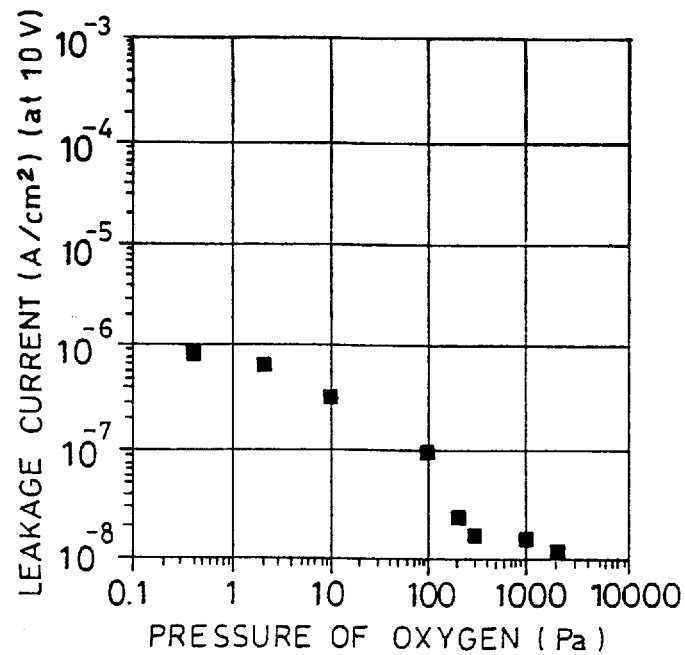
Figure 7:
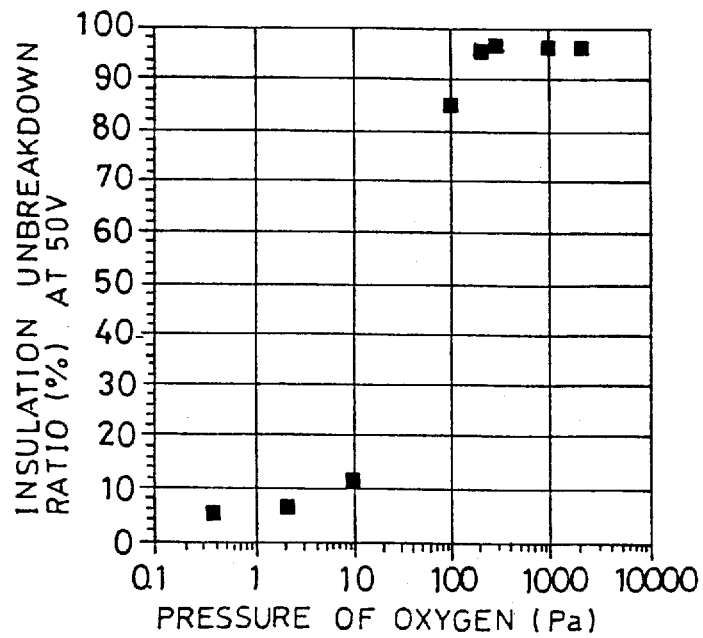

Oxygen having pressure of 200 Pa was introduced after the film formation in the foregoing embodiment. But, the pressure of introduced oxygen is not limited to this. FIG. 7(a) shows the correlation between the pressure of oxygen and the leakage current, when the oxide dielectric STO film 5 was formed at an oxygen pressure in a range of 0.4 Pa to 2,000 Pa. FIG. 7(b) shows the correlation between the pressure of oxygen and the dielectric unbreakdown ratio at a voltage of 50 V. These two graphs reveal that the oxide dielectric STO film 5 could have good dielectric properties with regard to the leakage current, and the dielectric unbreakdown ratio at a voltage of 50 V, provided that the pressure of oxygen is not less than 100 Pa.

As mentioned above, an oxide dielectric thin film device, which employs an oxide dielectric thin film made by the production method proposed by the present invention, can be adapted to any device, provided that such a film device is provided with at least electrodes and an oxide dielectric thin film and utilizes the ferroelectric effect, the piezoelectric effect, the pyroelectric effect, the electro-optical effect, or other effect.

Note that the material of the oxide dielectric thin film is not limited to $SrTiO_3$, which was utilized in the above embodiment. Any oxide dielectric material which contains oxygen may be substituted for such a dielectric material: for example, ferroelectric materials and dielectric materials with high dielectric constant, such as $SrTiO_3$, $(Ba_xSr_{1-x})TiO_3$, $LiNbO_3$, $LiTaO_3$, $CaBi_4Ti_4O_{15}$, $KNbO_3$, $NaNbO_3$, $Pb(Zr, Ti)O_3$, $(Pb_xLa_{1-x})TiO_3$, $(Pb_xLa_{1-x})(Zr_yTi_{1-y})O$, $Bi_4Ti_3O_{12}$, and $BaTiO_3$.

As has been described previously, the method of the present invention for producing the oxide dielectric thin film device 8 is comprised of the steps of (1) forming on a substrate an oxide dielectric STO film 5 having a predetermined thickness in a film forming chamber, and introducing oxygen into the film forming chamber so that pressure of the introduced oxygen is higher than that during the oxide dielectric STO film formation, without taking the oxide dielectric STO film 5 out of the film forming chamber, and (2) keeping the substrate for a predetermined period of time in the film forming chamber and then cooling it down in the film forming chamber.

Therefore, even though oxygen is not sufficiently absorbed in the oxide dielectric STO film 5 in the film forming process due to changes in conditions of the film formation, such as filming period and temperature, enough oxygen is supplied to the oxide dielectric STO film 5 after the film formation is completed. As a result, the defects of oxygen in the oxide dielectric STO film 5 are reduced.

In addition, since the foregoing arrangement is able to provide the oxide dielectric STO film 5 which has less oxygen defects, it is also able to provide a high-quality oxide dielectric thin film device 8 which has improved dielectric properties, such as higher dielectric constant, less leakage current, and less dielectric breakdown voltage than before.

According to the production method of the oxide dielectric thin film device 8 of the present invention, the pressure of oxygen introduced in the film forming chamber after the film formation is set to or higher than 100 Pa.

Therefore, even though oxygen is not sufficiently absorbed in the oxide dielectric STO film 5 in the film forming process, the oxide dielectric STO film 5 is adequately supplied with oxygen after the film formation. Therefore, when the oxide dielectric thin film device 8 is produced by utilizing the oxide dielectric STO film 5, the oxide dielectric thin film device 8 can be achieved, which suffers from remarkably small leakage current and which hardly exhibits dielectric breakdown.

According to the production method of the oxide dielectric thin film device 8 of the present invention, the substrate is kept in the film forming chamber for not less than 5 minutes.

Therefore, even though oxygen is not sufficiently absorbed in the oxide dielectric STO film 5 in the film forming process, the oxide dielectric STO film 5 is adequately supplied with oxygen after the film formation. Accordingly, the foregoing arrangement ensures to provide a high-quality dielectric thin film device having improved dielectric properties, such as high dielectric constant, small leakage current, and great dielectric strength. In addition, with the arrangement, the yield can be surely increased.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of producing a dielectric thin film device provided with at least electrodes and an oxide dielectric thin film, said method comprising the steps of:

forming on a substrate the oxide dielectric thin film in a film forming chamber, and introducing oxygen into the film forming chamber so that the pressure of the introduced oxygen is higher than that during the oxide dielectric thin film formation, without taking the oxide dielectric thin film out of the film forming chamber; and keeping the substrate in the film forming chamber at said higher oxygen partial pressure, and thereafter cooling the dielectric thin film down in the film forming chamber.

2. The method of producing a dielectric thin film device as set forth in claim 1, wherein the pressure of oxygen is set to or higher than 100 Pa.

3. The method of producing a dielectric thin film device as set forth in claim 1, wherein the substrate is kept in the film forming chamber for not less than 5 minutes.

4. The method of producing a dielectric thin film device as set forth in claim 1, wherein the oxide dielectric thin film is made of $SrTiO_3$.

5. The method of producing a dielectric thin film device as set forth in claim 2, wherein the substrate is kept in the film forming chamber for not less than 5 minutes.

6. The method of producing a dielectric thin film device as set forth in claim 4, wherein the pressure of oxygen is set to or higher than 100 Pa.

7. The method of producing a dielectric thin film device as set forth in claim 4, wherein the substrate is kept in the film forming chamber for not less than 5 minutes.

8. The method of producing a dielectric thin film device as set forth in claim 6, wherein the substrate is kept in the film forming chamber for not less than 5 minutes.

9. A method for forming a thin oxide dielectric film on a substrate comprising:

i) forming said thin oxide dielectric film on a substrate in an atmosphere having a first oxygen partial pressure;

ii) thereafter increasing the partial pressure of oxygen in said atmosphere to a second oxygen partial pressure and maintaining said thin oxide film in said atmosphere having said second oxygen partial pressure; and iii) thereafter cooling said thin oxide film in said atmosphere having said second oxygen partial pressure.

10. The method of claim 9, wherein said second oxygen partial pressure is at least 100 Pa.

11. The method of claim 9, wherein said second oxygen partial pressure ranges from 100 to 2000 Pa.

12. The method of claim 9, wherein said maintaining step (ii) is performed for at least 5 minutes.

13. The method of claim 9, wherein said oxide thin film is made of $SrTiO_3$.

14. The method of claim 9, wherein said second oxygen partial pressure is at least 100 Pa.

15. The method of claim 12, wherein said second oxygen partial pressure is at least 100 Pa.

16. A method for forming a thin oxide dielectric film on a substrate comprising:

i) forming said thin oxide dielectric film on a substrate in an evacuated chamber;

ii) thereafter increasing the partial pressure of oxygen in said atmosphere to a set oxygen partial pressure, and maintaining said thin oxide film in said atmosphere having said set oxygen partial pressure; and iii) thereafter cooling said thin oxide film in said atmosphere having said set oxygen partial pressure.

17. The method of claim 16, wherein said set oxygen partial pressure ranges from 100 to 2000 Pa.

18. The method of claim 17, wherein said maintaining step (ii) is performed for at least 5 minutes.

19. The method of claim 17, wherein said oxide thin film is made of $SrTiO_3$.

20. The method of claim 9, wherein the thin oxide film is maintaining step ii) is performed for a maximum of 5 minutes.

* * * * *